(12) United States Patent
Wang et al.

(10) Patent No.: US 8,884,337 B2
(45) Date of Patent: Nov. 11, 2014

(54) OUTPUT BUFFER

(71) Applicant: United Microelectronics Corp., Hsin-Chu (TW)

(72) Inventors: Chang-Tzu Wang, Taoyuan County (TW); Ping-Chen Chang, Pingtung County (TW); Tien-Hao Tang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/858,927

(22) Filed: Apr. 8, 2013

(65) Prior Publication Data

US 2014/0300391 A1 Oct. 9, 2014

(51) Int. Cl.
*H01L 27/118* (2006.01)
*H03K 3/013* (2006.01)

(52) U.S. Cl.
CPC ..................................... *H03K 3/013* (2013.01)
USPC .... 257/202; 257/203; 257/204; 257/E27.108; 257/E27.11

(58) Field of Classification Search
USPC ............ 257/202, 203, 204, E27.108, E27.11; 438/142
See application file for complete search history.

(56) References Cited

U.S. PATENT DOCUMENTS

| 2002/0020891 A1* | 2/2002 | Madurawe et al. ............ 257/408 |
| 2010/0284210 A1* | 11/2010 | Chen et al. ..................... 365/104 |
| 2013/0095580 A1* | 4/2013 | Or-Bach et al. ................. 438/17 |

* cited by examiner

*Primary Examiner* — Timor Karimy
(74) *Attorney, Agent, or Firm* — Winston Hsu; Scott Margo

(57) ABSTRACT

An output buffer includes an input/output end, a voltage source, a first transistor and a second transistor. The first transistor includes a first end coupled to the input/output end, a second end coupled to the voltage source, and a control end coupled to the voltage source. The second transistor includes a first end coupled to the input/output end, a second end coupled to the voltage source, and a control end coupled to the voltage source. The control end of the first transistor and the control end of the second transistor are substantially perpendicular to each other, and the punch through voltage of the first transistor is higher than the punch through voltage of the second transistor.

10 Claims, 6 Drawing Sheets

OUTPUT BUFFER

BACKGROUND OF THE INVENTION

1. Field of the Invention

The present invention relates to an output buffer, especially an output buffer having two transistors configured perpendicular to one another.

2. Description of the Prior Art

In order to resist noise interference, an output buffer is usually configured at the input or output end of the electronic circuitry. Besides, the electronic circuitry configured with the buffer has the advantages of generating symmetric output waveforms, high alternative current voltage gain, narrow bandwidth and small input capacitance. However, the added buffer might cause some delay in signal transmission.

Please refer to FIGS. 1, 2 and 3. FIG. 1 shows a prior art output buffer 100. FIG. 2 shows the I-V (current-to-voltage) curve of the input/output end I/O in FIG. 1. FIG. 3 shows the output buffer 100 with an additional resistor 30. As shown in FIG. 1, the output buffer 100 comprises a first transistor 12 and a second transistor 22. The second transistor 22 is used as an electrostatic discharge circuit. When the electrostatic discharge (ESD) effect occurs in the output buffer 100, the snapback effect will occur as shown in the I-V curve of the input/output end I/O. However, the ideal I-V curve of the input/output end I/O should be like the dashed part in FIG. 2. To improve the I-V curve of the input/output end I/O, one approach is to turn on the second transistor 22 faster. As shown in FIG. 3, by adding the resistor 30 between the control end of the second transistor 22 and the voltage source VSS, the second transistor 22 can be turned on faster than the first transistor 21. But the resistor 30 occupies extra space, making the layout of the output buffer 100 more difficult.

SUMMARY OF THE INVENTION

An embodiment of the present invention relates to an output buffer. The output buffer comprises an input/output (I/O) end, a first voltage source, a first transistor and a second transistor. The first transistor comprises a first end coupled to the I/O end, a second end coupled to the first voltage source, and a control end coupled to the first voltage source and formed along a first direction. The second transistor comprises a first end coupled to the I/O end, a second end coupled to the first voltage source, and a control end coupled to the first voltage source and formed along a second direction substantially perpendicular to the first direction. A punch through voltage of the first transistor is higher than a punch through voltage of the second transistor.

Another embodiment of the present invention relates to an output buffer. The output buffer comprises an active region, a first metal oxide semiconductor transistor and a second metal oxide semiconductor transistor. The first metal oxide semiconductor transistor comprises a first gate, a first source and a first drain. The first gate is formed along a first direction on the active region. The first source is formed at a first side of the first gate. The first drain is formed at a second side of the first gate. The second metal oxide semiconductor transistor comprises a second gate, a second source and a second drain. The second gate is formed along a second direction on the active region. The first direction is substantially perpendicular to the second direction. The second source is formed at a first side of the second gate. The second drain is formed at a second side of the second gate. The first drain is connected to the second drain. A punch through voltage of the first metal oxide semiconductor transistor is higher than a punch through voltage of the second metal oxide semiconductor transistor.

These and other objectives of the present invention will no doubt become obvious to those of ordinary skill in the art after reading the following detailed description of the preferred embodiment that is illustrated in the various figures and drawings.

DETAILED DESCRIPTION

The detailed descriptions of the present invention are exemplified below in examples. However, the examples are merely used to illustrate the present invention, not to limit the present invention. Because one skilled in the art may modify the present invention or combine the present invention with some features within the scope of the present invention, the claimed scope of the present invention should be referred to in the following claims. In the present specification and claims, the term "comprising" is open type and should not be viewed as the term "consisted of." Besides, the terms "electrically couple" and "couple" can be referring to either directly connecting or indirectly connecting between elements. Thus, if it is described in the below contents of the present invention that a first device is electrically coupled to a second device, the first device can be directly connected to the second device, or indirectly connected to the second device through other devices or means.

The embodiments and figures are provided as follows in order to illustrate the present invention in detail, but the claimed scope of the present invention is not limited by the provided embodiments and figures. Further, the numbers of steps performed in the methods of the present invention are not used to limit the priority of performing steps of the present invention. Any methods formed by recombining the steps of the present invention belong to the scope of the present invention.

Figure 1:
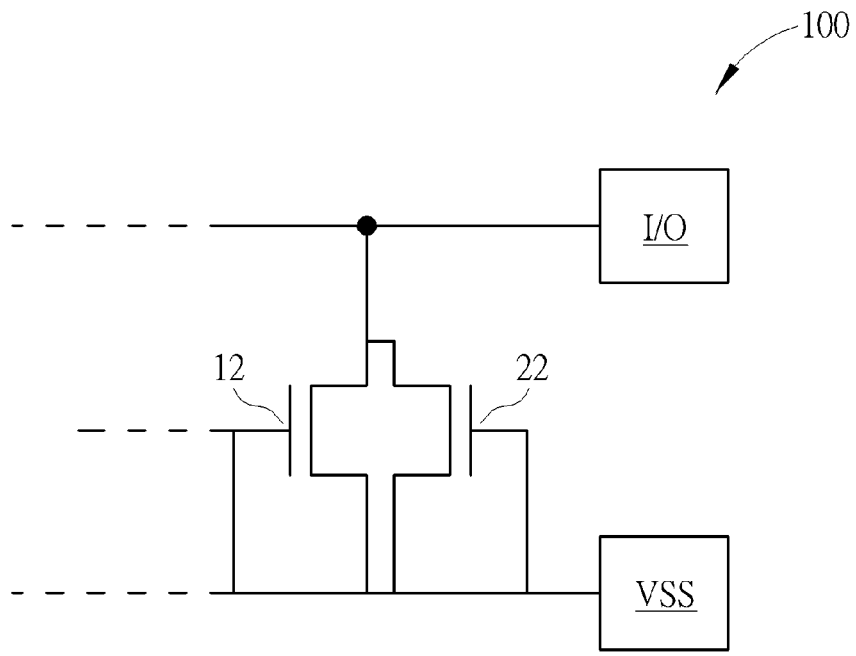
FIG. 1 shows a prior art output buffer.
Figure 2:
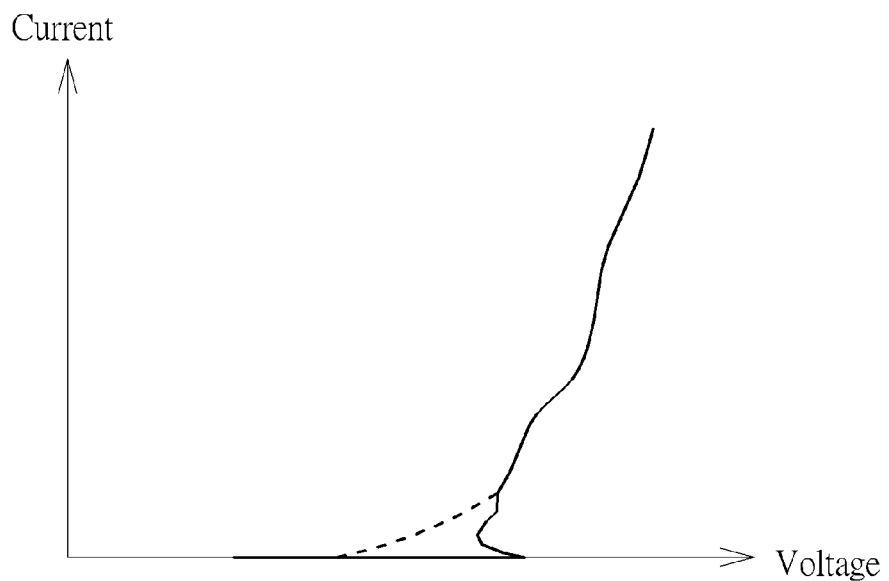
FIG. 2 shows the I-V curve of the input/output end of the output buffer in FIG. 1.
Figure 3:
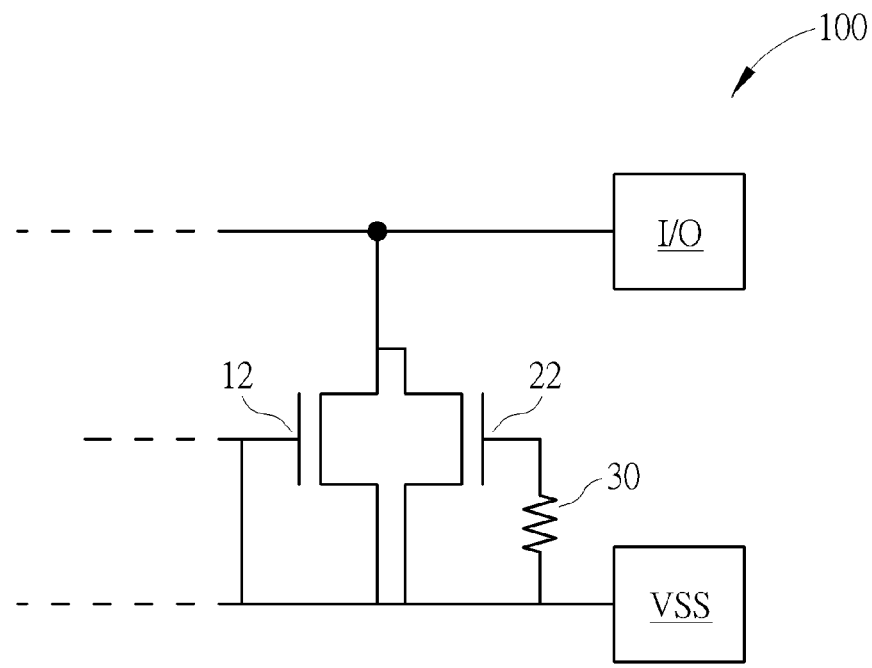
FIG. 3 shows the output buffer in FIG. 1 with an additional resistor.
Figure 4:
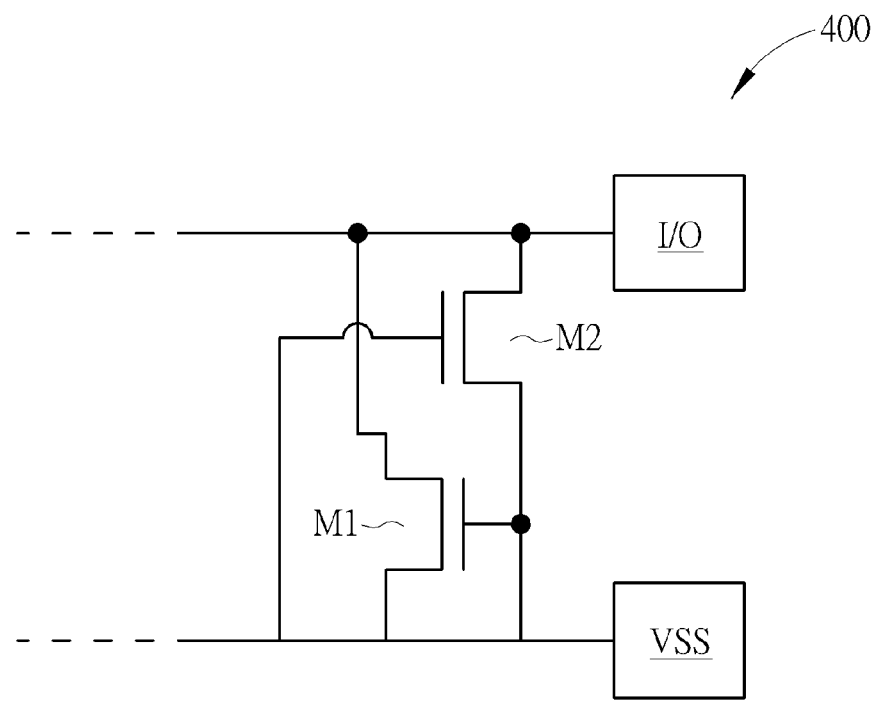
FIG. 4 shows an output buffer according to a first embodiment of the present invention.

Please refer to FIG. 4, which shows an output buffer 400 according to a first embodiment of the present invention. As shown in FIG. 4, the output buffer 400 comprises an input/output end I/O, a first voltage source VSS, a first N type metal oxide semiconductor (NMOS) transistor M1 and a second NMOS transistor M2. The first NMOS transistor M1 comprises a drain coupled to the input/output end I/O, a source coupled to the first voltage source VSS, and a gate coupled to the first voltage source VSS. The second NMOS transistor M2 comprises a drain coupled to the input/output end I/O, a source coupled to the first voltage source VSS, and a gate coupled to the first voltage source VSS. The gate of the first NMOS transistor M1 is formed substantially perpendicular to the gate of the second NMOS transistor M2. The punch through voltage of the first NMOS transistor M1 is higher than the punch through voltage of the second NMOS transistor M2. The first voltage source VSS is a low voltage source. The first NMOS transistor M1 and the second NMOS transistor M2 form a buffer circuit or an electrostatic discharge circuit.

Figure 5:
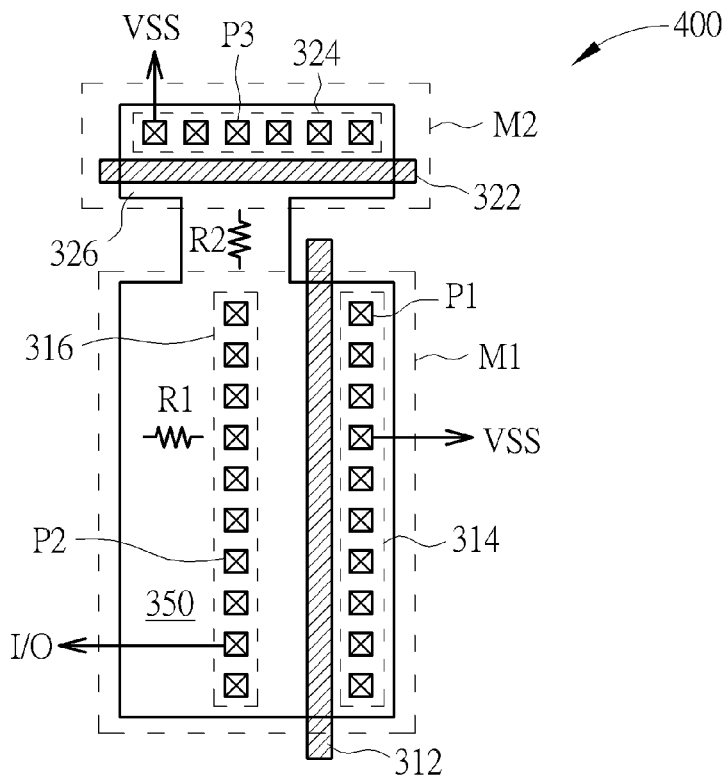
FIG. 5 shows a structure of the output buffer of FIG. 4.

Please refer to FIG. 5, which shows a structure of the output buffer 400. As shown in FIG. 5, the output buffer 400 further comprises an active region 350, a plurality of first contacts P1, a plurality of second contacts P2 and a plurality of third contacts P3. In the output buffer 400, the first NMOS transistor M1 comprises a first gate 312, a first source 314 and a first drain 316. The first gate 312 is formed along a first direction (vertical) on the active region 350. The first source 314 is formed at a first side (right side) of the first gate 312. The first drain 316 is formed at a second side (left side) of the first gate 312. The second NMOS transistor M2 comprises a second gate 322, a second source 324 and a second drain 326. The second gate 322 is formed along a second direction (the horizontal direction) on the active region 350. The first direction is substantially perpendicular to the second direction. The second source 324 is formed at a first side (the upper side) of the second gate 322. The second drain 326 is formed at a second side (lower side) of the second gate 322. The first drain 316 is connected to the second drain 326. The first side of the first gate 312 and the second side of the first gate 312 are opposite, and the first side of the second gate 322 and the second side of the second gate 322 are opposite. The resistance R1 between the first drain 316 and the input/output end I/O is smaller than the resistance R2 between the second drain 326 and the input/output end I/O. The punch through voltage of the first NMOS transistor M1 is higher than the punch through voltage of the second NMOS transistor M2. The plurality of first contacts P1 are formed on the first source 314 and coupled to the first voltage source VSS. The plurality of second contacts P2 are formed on the first drain 316 and coupled to the input/output end I/O. The plurality of third contacts P3 are formed on the second source 324 and coupled to the first voltage source VSS.

Compared with the prior art, the second NMOS transistor M2 is configured substantially perpendicular to the first NMOS transistor M1, so no dummy vertical Polysilicon needs to be formed on the output buffer 400, reducing the overall area of the output buffer 400. Besides, since planting pocket implants on MOS transistors can prevent the MOS transistors from being punched through. Though the first NMOS transistor M1 is planted with pocket implants during the manufacturing process, the second NMOS transistor M2 is not planted with pocket implants during the manufacturing process. Therefore, the second NMOS transistor M2 can be turned on faster than the first NMOS transistor M1 without adding additional passive elements to the output buffer 400 to avoid the snapback effect in the I-V curve of the input/output end I/O. However, the second gate 322 can also have pocket implants, but the amount of pocket implants in the second gate 322 is smaller than the amount of pocket implants in the first gate 312. This will enable the second NMOS transistor M2 to be turned on faster than the first NMOS transistor M1.

Figure 6:
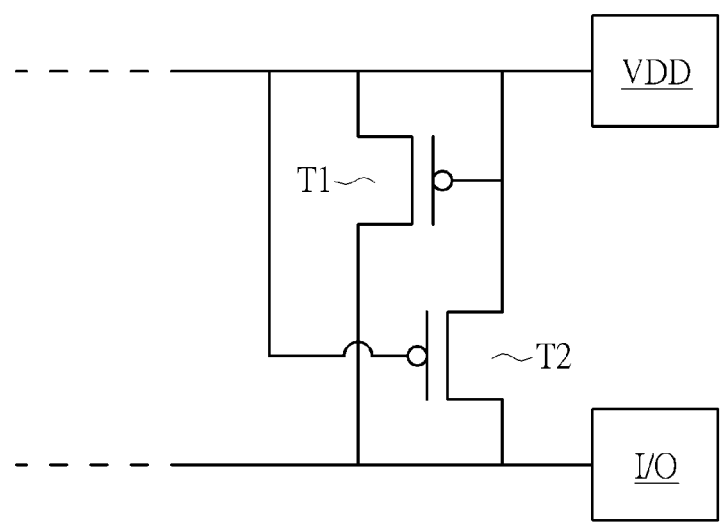
FIG. 6 shows an output buffer according to a second embodiment of the present invention.

Please refer to FIG. 6, which shows an output buffer 600 according to a second embodiment of the present invention. Please refer to FIG. 6, which shows an output buffer 600 according to a second embodiment of the present invention. As shown in FIG. 4, the output buffer 600 comprises an input/output end I/O, a second voltage source VDD, a first P type metal oxide semiconductor (PMOS) transistor T1 and a second PMOS transistor T2. The first PMOS transistor T1 comprises a drain coupled to the input/output end I/O, a source coupled to the second voltage source VDD, and a gate coupled to the second voltage source VDD. The second PMOS transistor T2 comprises a drain coupled to the input/output end I/O, a source coupled to the second voltage source VDD, and a gate coupled to the second voltage source VDD. The gate of the first PMOS transistor T1 is formed substantially perpendicular to the gate of the second PMOS transistor T2. The punch through voltage of the first PMOS transistor T1 is higher than the punch through voltage of the second PMOS transistor T2. The second voltage source VDD is a high voltage source. The first PMOS transistor T1 and the second PMOS transistor T2 form a buffer circuit or an electrostatic discharge circuit.

Figure 7:
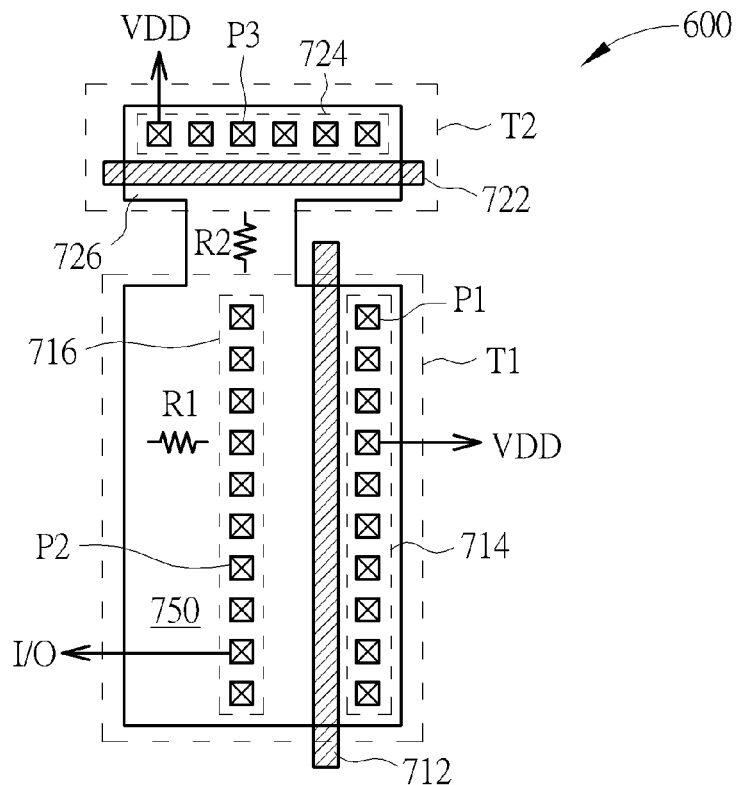
FIG. 7 shows a structure of the output buffer of FIG. 6.

Please refer to FIG. 7, which shows a structure of the output buffer 600. As shown in FIG. 7, the output buffer 600 further comprises an active region 750, a plurality of first contacts P1, a plurality of second contacts P2 and a plurality of third contacts P3. In the output buffer 600, the first PMOS transistor T1 comprises a first gate 712, a first source 714 and a first drain 716. The first gate 712 is formed along a first direction (vertical) on the active region 750. The first source 714 is formed at a first side (right side) of the first gate 712. The first drain 716 is formed at a second side (left side) of the first gate 712. The second PMOS transistor T2 comprises a second gate 722, a second source 724 and a second drain 726. The second gate 722 is formed along a second direction (the horizontal direction) on the active region 750. The first direction is substantially perpendicular to the second direction. The second source 724 is formed at a first side (the upper side) of the second gate 722. The second drain 726 is formed at a second side (lower side) of the second gate 722. The first drain 716 is connected to the second drain 726. The first side of the first gate 712 and the second side of the first gate 712 are opposite, and the first side of the second gate 722 and the second side of the second gate 722 are opposite. The resistance R1 between the first drain 716 and the input/output end I/O is smaller than the resistance R2 between the second drain 726 and the input/output end I/O. The punch through voltage of the first PMOS transistor T1 is higher than the punch through voltage of the second PMOS transistor T2. The plurality of first contacts P1 are formed on the first source 714 and coupled to the second voltage source VDD. The plurality of second contacts P2 are formed on the first drain 716 and coupled to the input/output end I/O. The plurality of third contacts P3 are formed on the second source 724 and coupled to the second voltage source VDD.

Compared with the prior art, the second PMOS transistor T2 is configured substantially perpendicular to the first PMOS transistor T1, so no dummy vertical Polysilicon needs to be formed on the output buffer 600, reducing the overall area of the output buffer 600. Besides, since planting pocket implants on MOS transistors can prevent the MOS transistors from being punched through. Though the first PMOS transistor T1 is planted with pocket implants during the manufacturing process, the second PMOS transistor T2 is not planted with pocket implants during the manufacturing process. Therefore, the second PMOS transistor T2 can be turned on faster than the first PMOS transistor T1 without adding additional passive elements to the output buffer 600 to avoid the snapback effect in the I-V curve of the input/output end I/O. However, the second gate 722 can also have pocket implants, but the amount of pocket implants in the second gate 722 is smaller than the amount of pocket implants in the first gate 712. This will enable the second PMOS transistor T2 to be turned on faster than the first PMOS transistor T1.

Figure 8:
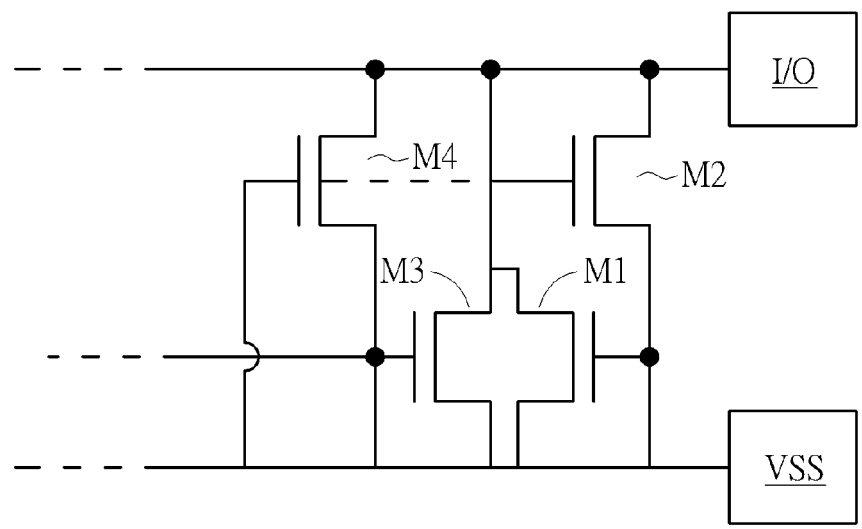
FIG. 8 shows an output buffer according to a third embodiment of the present invention.

Please refer to FIG. 8, which shows an output buffer 800 according to a third embodiment of the present invention. As shown in FIG. 8, the difference between the output buffer 800 and the output buffer 400 is that, the output buffer 800 further comprises a third NMOS transistor M3 and a fourth NMOS transistor M4. The third NMOS transistor M3 comprises a drain coupled to the input/output end I/O, a source coupled to the first voltage source VSS, and a gate coupled to the first voltage source VSS. The fourth NMOS transistor M4 comprises a drain coupled to the input/output end I/O, a source coupled to the first voltage source VSS, and a gate coupled to the first voltage source VSS. The gate of the first NMOS transistor M1 is formed substantially parallel to the gate of the third NMOS transistor M3. The gate of the second NMOS transistor M2 is formed substantially parallel to the gate of the fourth NMOS transistor M4. The punch through voltage of the third NMOS transistor M3 is higher than the punch through voltage of the fourth NMOS transistor M4. In the third embodiment, the first voltage source VSS is a low voltage source. The first NMOS transistor M1 and the second NMOS transistor M2 can form an electrostatic discharge circuit, and the third NMOS transistor M3 and the fourth NMOS transistor M4 can form a buffer circuit.

Figure 9:
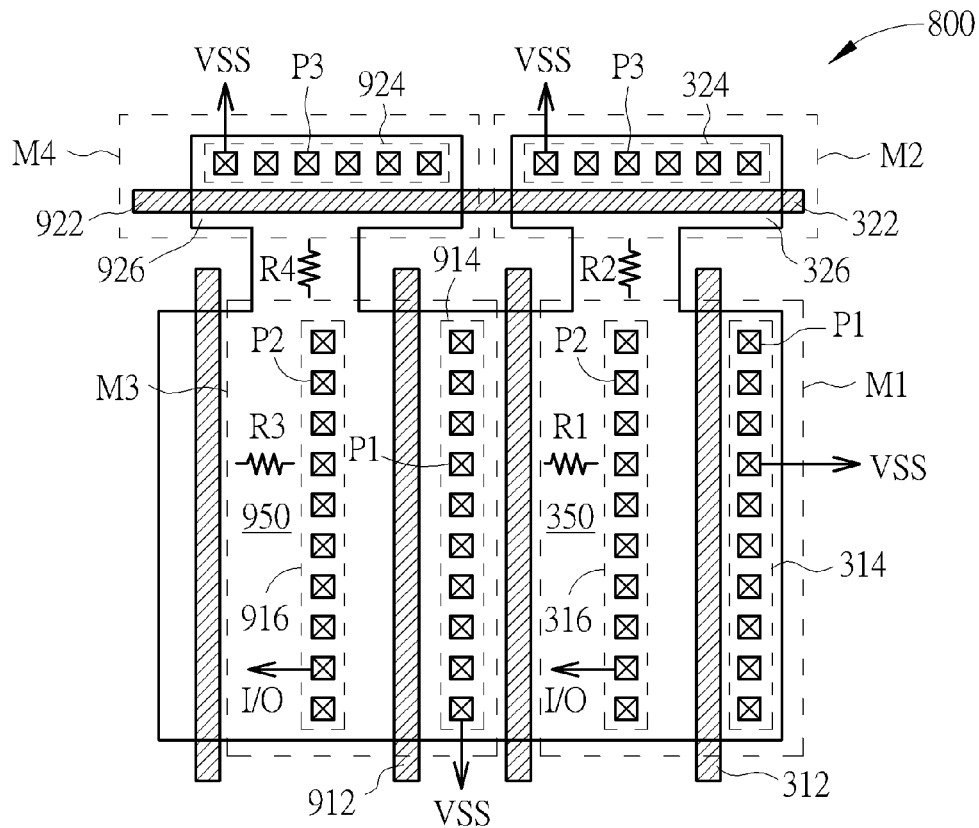
FIG. 9 shows a structure of the output buffer of FIG. 8.

Please refer to FIG. 9, which shows a structure of the output buffer 800. As shown in FIG. 9, compared with the output buffer 400, the output buffer 800 further comprises the third NMOS transistor M3 and the fourth NMOS transistor M4. The third NMOS transistor M3 comprises a third gate 912, a third source 914 and a third drain 916. The third gate 912 is formed along the first direction (vertical) on the active region 950. The third source 914 is formed at a first side (right side) of the third gate 912. The third drain 916 is formed at a second side (left side) of the third gate 912. The fourth NMOS transistor M4 comprises a fourth gate 922, a fourth source 924 and a fourth drain 926. The fourth gate 922 is formed along the second direction (the horizontal direction) on the active region 950. The first direction is substantially perpendicular to the second direction. The fourth source 924 is formed at a first side (the upper side) of the fourth gate 922. The fourth drain 926 is formed at the second side (lower side) of the fourth gate 922. The third drain 916 is connected to the fourth drain 926. The second source 324 and fourth source 924 are not directly connected. The second drain 326 and fourth drain 926 are not directly connected. The second gate 322 is connected to the fourth gate 922. The punch through voltage of the third NMOS transistor M3 is higher than the punch through voltage of the fourth NMOS transistor M4. The first gate 312 and the third gate 912 comprise pocket implants, and the second gate 322 and the fourth gate 922 do not comprise any pocket implant. However, the second gate 322 and the fourth gate 922 can also have pocket implants, but the amount of pocket implants in the second gate 322 and the fourth gate 922 is smaller than the amount of pocket implants in the first gate 312 and the third gate 912. This will enable the second NMOS transistor M2 to be turned on faster than the first NMOS transistor M1 and the fourth NMOS transistor M4 to be turned on faster than the third NMOS transistor M3.

In the output buffer 800, a plurality of first contacts P1 are formed on the first source 314 and the third source 914, and coupled to the first voltage source VSS. A plurality of second contacts P2 are formed on the first drain 316 and third drain 916, and coupled to the input/output end I/O. The plurality of third contacts P3 are formed on the second source 324 and the fourth source 924, and coupled to the first voltage source VSS. The resistance R1 between the first drain 316 and the input/output end I/O is smaller than the resistance R2 between the second drain 326 and the input/output end I/O. The resistance R3 between the third drain 916 and the input/output end I/O is smaller than resistance R4 between the fourth drain 926 and the input/output end I/O.

Similar to the technical effects provided by the output buffer 400, in the third embodiment, the second NMOS transistor M2 can be turned on faster than the first NMOS transistor M1 and the fourth NMOS transistor M4 can be turned on faster than the third NMOS transistor M3 without adding additional passive elements to the output buffer 800 to avoid the snapback effect occurring in the I-V curves of the input/output end I/O. Besides, compared with the output buffer 400, the output buffer 800 provides both the electrostatic discharge circuit and the buffer circuit, instead of providing the electrostatic discharge circuit or the buffer circuit only.

Figure 10:
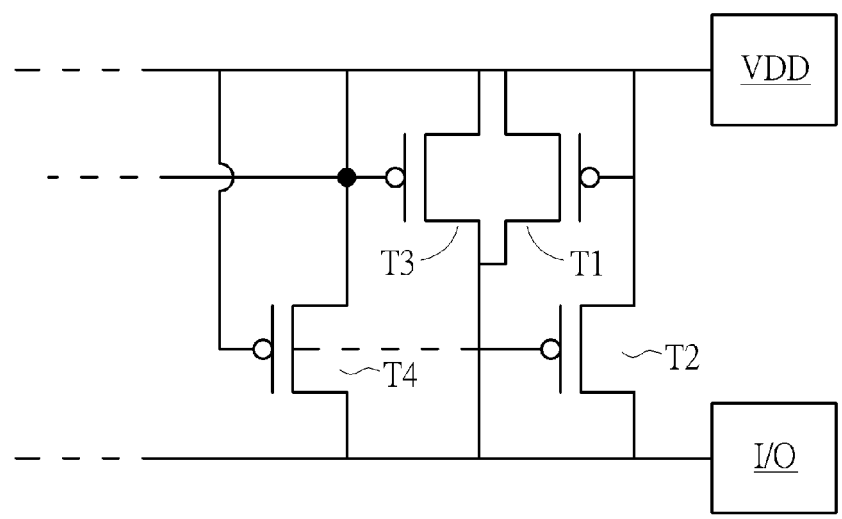
FIG. 10 shows an output buffer according to a fourth embodiment of the present invention.

Please refer to FIG. 10, which shows an output buffer 1000 according to a fourth embodiment of the present invention. As shown in FIG. 10, the difference between the output buffer 1000 and the output buffer 600 is that, the output buffer 1000 further comprises a third PMOS transistor T3 and a fourth PMOS transistor T4. The third PMOS transistor T3 comprises a drain coupled to the input/output end I/O, a source coupled to the second voltage source VDD, and a gate coupled to the second voltage source VDD. The fourth PMOS transistor T4 comprises a drain coupled to the input/output end I/O, a source coupled to the second voltage source VDD, and a gate coupled to the second voltage source VDD. The gate of the first PMOS transistor T1 is formed substantially parallel to the gate of the third PMOS transistor T3. The gate of the second PMOS transistor T2 is formed substantially parallel to the gate of the fourth PMOS transistor T4. The punch through voltage of the third PMOS transistor T3 is higher than the punch through voltage of the fourth PMOS transistor T4. In the fourth embodiment, the second voltage source VDD is a high voltage source. The first PMOS transistor T1 and the second PMOS transistor T2 can form an electrostatic discharge circuit, and the third PMOS transistor T3 and the fourth PMOS transistor T4 can form a buffer circuit.

Figure 11:
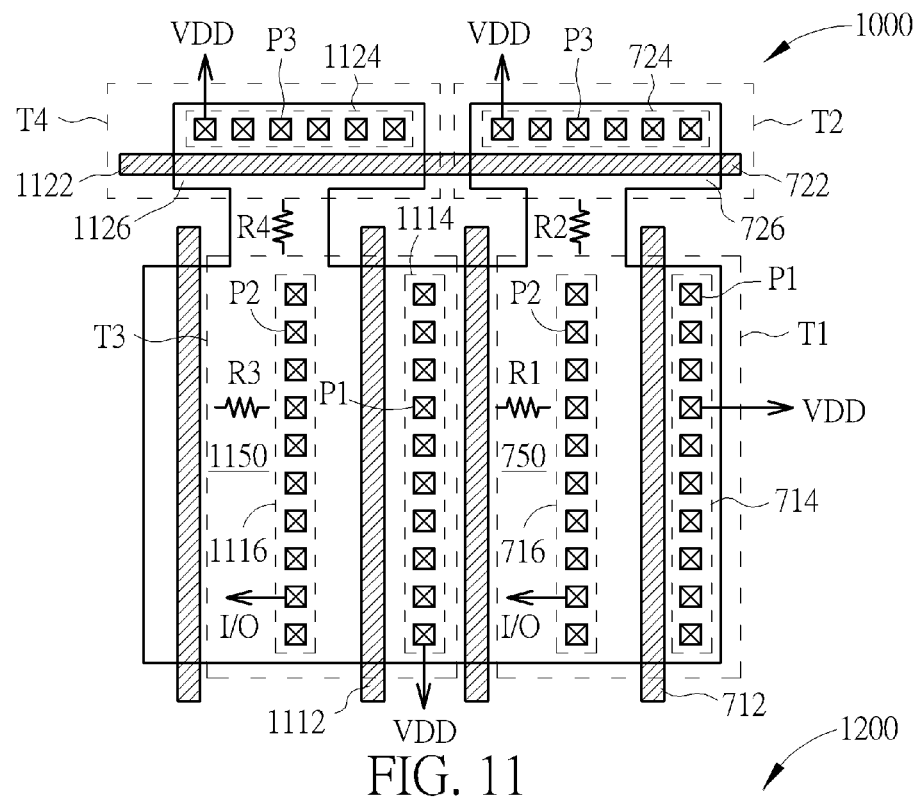
FIG. 11 shows a structure of the output buffer of FIG. 10.

Please refer to FIG. 11, which shows a structure of the output buffer 1000. As shown in FIG. 11, compared with the output buffer 600, the output buffer 1000 further comprises the third PMOS transistor T3 and the fourth PMOS transistor T4. The third PMOS transistor T3 comprises a third gate 1112, a third source 1114 and a third drain 1116. The third gate 1112 is formed substantially along the first direction (vertical) on the active region 1150. The third source 1114 is formed at a first side (right side) of the third gate 1112. The third drain 1116 is formed at a second side (left side) of the third gate 1112. The fourth PMOS transistor T4 comprises a fourth gate 1122, a fourth source 1124 and a fourth drain 1126. The fourth gate 1122 is formed substantially along a second direction (the horizontal direction) on the active region 1150. The first direction is substantially perpendicular to the second direction. The fourth source 1124 is formed at a first side (the upper side) of the fourth gate 1122. The fourth drain 1126 is formed at the second side (lower side) of the fourth gate 1122. The third drain 1116 is connected to the fourth drain 1126. The second source 724 and fourth source 1124 are not directly connected. The second drain 726 and fourth drain 1126 are not directly connected. The second gate 722 is connected to the fourth gate 1122. The punch through voltage of the third PMOS transistor T3 is higher than the punch through voltage of the fourth PMOS transistor T4. The first gate 712 and the third gate 1112 comprise pocket implants, and the second gate 722 and the fourth gate 1122 do not comprise any pocket implant. However, the second gate 722 and the fourth gate 1122 can also have pocket implants, but the amount of pocket implants in the second gate 722 and the fourth gate 1122 is smaller than the amount of pocket implants in the first gate 712 and the third gate 1112. This will enable the second PMOS transistor T2 to be turned on faster than the first PMOS transistor T1 and the fourth PMOS transistor T4 to be turned on faster than the third PMOS transistor T3.

In the output buffer 1000, a plurality of first contacts P1 are formed on the first source 714 and the third source 1114, and coupled to the second voltage source VDD. A plurality of second contacts P2 are formed on the first drain 716 and third drain 1116, and coupled to the input/output end I/O. The plurality of third contacts P3 are formed on the second source 724 and the fourth source 1124, and coupled to the second voltage source VDD. The resistance R1 between the first drain 716 and the input/output end I/O is smaller than the resistance R2 between the second drain 1116 and the input/output end I/O. The resistance R3 between the third drain 1116 and the input/output end I/O is smaller than resistance R4 between the fourth drain 1126 and the input/output end I/O.

Similar to the technical effects provided by the output buffer 600, in the fourth embodiment, the second PMOS transistor T2 can be turned on faster than the first PMOS transistor T1 and the fourth PMOS transistor T4 can be turned on faster than the third PMOS transistor T3 without adding additional passive elements to the output buffer 1000 to avoid the snapback effect in the I-V curves of input/output end I/O. Besides, compared with the output buffer 600, the output buffer 1000 provides both the electrostatic discharge circuit and the buffer circuit, instead of providing the electrostatic discharge circuit or the buffer circuit only.

Figure 12:
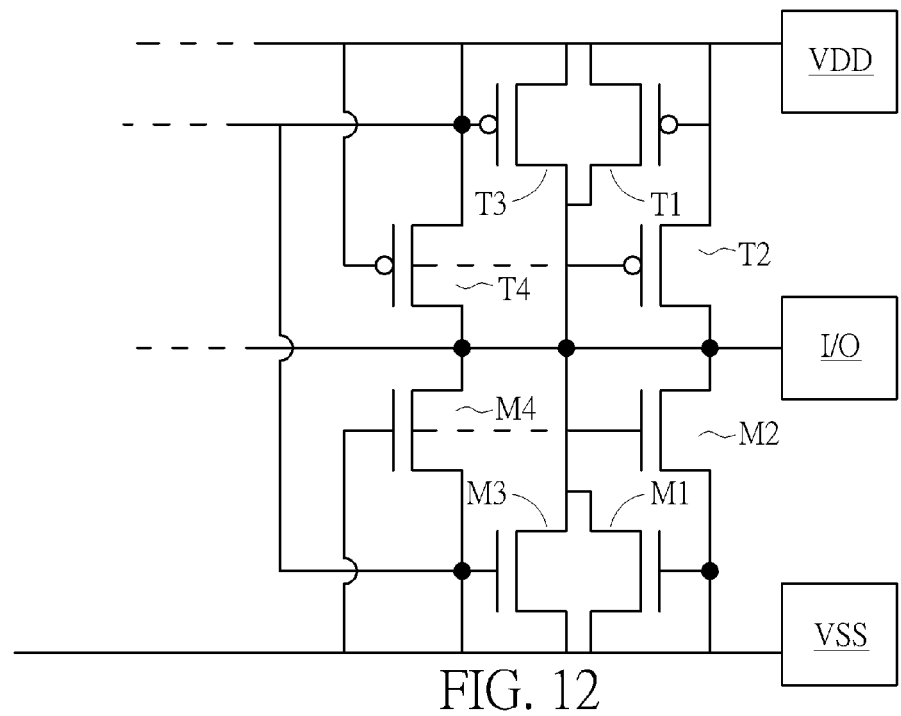
FIG. 12 shows an output buffer according to a fifth embodiment of the present invention.

Please refer to FIG. 12, which shows an output buffer 1200 according to a fifth embodiment of the present invention. As shown in FIG. 12, the difference between the output buffer 1200 and the output buffer 800 is that, the output buffer 1200 further comprises a first PMOS transistor T1, a second PMOS transistor T2, a third PMOS transistor T3 and a fourth PMOS transistor T4. The first PMOS transistor T1 comprises a drain coupled to the input/output end I/O, a source coupled to the second voltage source VDD, and a gate coupled to the second voltage source VDD. The second PMOS transistor T2 comprises a drain coupled to the input/output end I/O, a source coupled to the second voltage source VDD, and a gate coupled to the second voltage source VDD. The third PMOS transistor T3 comprises a drain coupled to the input/output end I/O, a source coupled to the second voltage source VDD, and a gate coupled to the second voltage source VDD. The fourth PMOS transistor T4 comprises a drain coupled to the input/output end I/O, a source coupled to the second voltage source VDD, and a gate coupled to the second voltage source VDD. The gate of the first PMOS transistor T1 and the gate of the third PMOS transistor T3 are formed substantially parallel to the gate of the third NMOS transistor M3. The gate of the second PMOS transistor T2 and the gate of the fourth PMOS transistor T4 are formed substantially parallel to the gate of the fourth NMOS transistor M4. The punch through voltage of the first PMOS transistor T1 is higher than the punch through voltage of the second PMOS transistor T2. The punch through voltage of the third PMOS transistor T3 is higher than the punch through voltage of the fourth PMOS transistor T4. The structure of the output buffer 1200 can be generated according to FIGS. 9 and 11 of the present invention and will not be further described.

In the fifth embodiment, the output buffer 1200 integrates both the structures of the output buffers 800 and 1000, and can provide the technical effects of the output buffers 800 and 1000. In the fifth embodiment, the second NMOS transistor M2 can be turned on faster than the first NMOS transistor M1, the fourth NMOS transistor M4 can be turned on faster than the third NMOS transistor M3, the second PMOS transistor T2 can be turned on faster than the first PMOS transistor T1, and the fourth PMOS transistor T4 can be turned on faster than the third PMOS transistor T3 without adding additional passive elements to the output buffer 1200 to avoid the snapback effect occurring in the I-V curves of the input/output end I/O.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An output buffer, comprising:
   an active region;
   a first metal oxide semiconductor transistor, comprising:
      a first gate, formed along a first direction on the active region in a plan layout view of the output buffer;
      a first source, formed at a first side of the first gate; and
      a first drain, formed at a second side of the first gate; and
   a second metal oxide semiconductor transistor, comprising:
      a second gate, formed along a second direction on the active region in the plan layout view of the output buffer, the first direction being substantially perpendicular to the second direction;
      a second source, formed at a first side of the second gate; and
      a second drain, formed at a second side of the second gate, the first drain being connected to the second drain; and
   wherein a punch through voltage of the first metal oxide semiconductor transistor is higher than a punch through voltage of the second metal oxide semiconductor transistor.

2. The output buffer of claim 1, further comprising:
   a plurality of first contacts, formed on the first source and coupled to a first voltage source;
   a plurality of second contacts, formed on the first drain and coupled to an I/O end; and
   a plurality of third contacts, formed on the second source and coupled to the first voltage source.

3. The output buffer of claim 2, wherein the first voltage source is a low voltage source.

4. The output buffer of claim 2, wherein the first voltage source is a high voltage source.

5. The output buffer of claim 1, wherein the first side of the first gate and the second side of the first gate are opposite, and the first side of the second gate and the second side of the second gate are opposite.

6. The output buffer of claim 1, further comprising:
   a third metal oxide semiconductor transistor, comprising:
      a third gate, formed substantially along the first direction on the active region;
      a third source, formed at a first side of the third gate; and
      a third drain, formed at a second side of the third gate; and
   a fourth metal oxide semiconductor transistor, comprising:
      a fourth gate, formed substantially along the second direction on the active region;

a fourth source, formed at a first side of the fourth gate; and a fourth drain, formed at a second side of the fourth gate, the third drain being connected to the fourth drain; and wherein the second source and fourth source are not directly connected, the second drain and fourth drain are not directly connected, the second gate is connected to the fourth gate, a punch through voltage of the third metal oxide semiconductor transistor is higher than a punch through voltage of the fourth metal oxide semiconductor transistor.

7. The output buffer of claim 6, wherein the first gate and the third gate comprise pocket implants, and the second gate and the fourth gate do not comprise a pocket implant.

8. The output buffer of claim 6, wherein the first gate has more pocket implants than the second gate, and the third gate has more pocket implants than the fourth gate.

9. The output buffer of claim 1, wherein the first gate comprises pocket implants, and the second gate does not comprise a pocket implant.

10. The output buffer of claim 1, wherein the first gate has more pocket implants than the second gate.

\* \* \* \* \*